(12) United States Patent
Roy

(10) Patent No.: US 7,055,581 B1
(45) Date of Patent: Jun. 6, 2006

(54) IMPELLER DRIVEN ACTIVE HEAT SINK

(76) Inventor: Sanjay K. Roy, P.O. Box 248632, Coral Gables, FL (US) 33124

( * ) Notice: Subject to any disclaimer, the term of this patent is extended or adjusted under 35 U.S.C. 154(b) by 324 days.

(21) Appl. No.: 10/602,309

(22) Filed: Jun. 24, 2003

(51) Int. Cl.
*F28D 15/00* (2006.01)

(52) U.S. Cl. ............... 165/104.33; 165/80.3; 165/104.21; 361/697; 361/700; 361/704; 174/15.2; 257/714

(58) Field of Classification Search .......... 165/80.4, 165/104.26, 104.21, 104.33, 185; 361/697, 361/699, 700; 174/15.1, 15.2; 257/714–716
See application file for complete search history.

(56) References Cited

U.S. PATENT DOCUMENTS

| | | | | |
|---|---|---|---|---|
| 5,316,077 | A * | 5/1994 | Reichard | 165/104.28 |
| 5,441,102 | A * | 8/1995 | Burward-Hoy | 165/104.25 |
| 6,019,165 | A * | 2/2000 | Batchelder | 165/80.3 |
| 6,021,844 | A * | 2/2000 | Batchelder | 165/80.3 |
| 6,327,145 | B1 * | 12/2001 | Lian et al. | 361/697 |
| 6,408,937 | B1 * | 6/2002 | Roy | 165/104.33 |
| 6,529,377 | B1 * | 3/2003 | Nelson et al. | 361/699 |
| 6,648,064 | B1 * | 11/2003 | Hanson | 165/120 |
| 6,668,911 | B1 * | 12/2003 | Bingler | 165/80.4 |
| 6,839,234 | B1 * | 1/2005 | Niwatsukino et al. | 361/695 |

* cited by examiner

Primary Examiner—Terrell McKinnon
(74) Attorney, Agent, or Firm—Frank L. Kubler

(57) ABSTRACT

A heat transfer apparatus includes a heat source having a heat source maximum operating temperature; and a heat sink comprising a closed chamber having a chamber first end wall, a chamber second end wall and a circumferential chamber side wall interconnecting said chamber first end wall and said chamber second end wall, said walls defining a chamber interior space, at least one of said chamber first end wall and said chamber second end wall being a heat transfer wall, a heat transfer material retained within said chamber, and at least one impeller having an axis of impeller rotation and an impeller radius mounted within said chamber adjacent to said heat source to rotate about the axis of impeller rotation for moving the heat transfer material over said heat transfer wall and propelling said heat transfer material to a location thermally remote from said heat source for heat dissipation, wherein said chamber interior space extends perpendicular to the axis of impeller rotation a radial thermal spacing distance of at least two times the impeller radius.

20 Claims, 3 Drawing Sheets

IMPELLER DRIVEN ACTIVE HEAT SINK

FILING HISTORY

This application is based in part on the contents of disclosure document number 527536 filed on Mar. 10, 2003.

BACKGROUND OF THE INVENTION

1. Field of the Invention

The present invention relates generally to the field of heat dissipation devices known as heat sinks. More specifically the present invention relates to a heat sink including a chamber having a chamber first end wall and a chamber second end wall and a circumferential chamber side wall interconnecting the chamber first and second end walls, at least one of these walls being a heat transfer wall in thermal contact with a heat source, the chamber containing a heat transfer material and an impeller having radial blades for moving the material over the heat transfer wall and propelling the material to a heat exchange region thermally remote from the heat source for heat dissipation, the chamber being configured such that the impeller(s) gather and release liquid along liquid flow paths determined by the impeller rotation. In regions not swept by the impellers, high conductivity porous inserts can be included to ensure high heat transfer through the porous structure. The chamber of a first and second embodiments are closed and are differentiated by the heat transfer material. In the first embodiment, a liquid or similar flowable material is used, whereas in the second, a phase change heat transfer material is provided such that it melts with the heat received from the heat source, thereby becoming a flowable heat transfer material during operation. The chamber of a third embodiment has the general structure of the first and second embodiments except for the provision of a chamber entry port which gathers liquid from a location thermally remote from the heat source and external to the chamber and the chamber exit port delivers liquid to a heat exchange region external to the chamber.

2. Description of the Prior Art

A number of active and inactive heat transfer devices have been provided in the form of heat sinks and cold plates for transferring heat away from various electronic elements so that the temperatures of these devices remain within acceptable limits so that the devices operate at higher efficiency and require less shut down time for cooling. These have included simple heat sinks mounted on individual components to provide larger surface areas for enhanced dissipation of heat to the surrounding atmosphere either by natural or forced convection. For high power systems, entire boards have been mounted on liquid-cooled heat exchangers such as cold plates which transfer the waste heat to the atmosphere via a liquid-air radiator. The entire flow loops usually include pumps, valves, drive motors, or other components as required for specific applications.

Batchelder, U.S. Pat. No. 6,019,165, issued on Feb. 1, 2000 for a heat exchange apparatus teaches a chamber. However, in the embodiments of Batchelder, shown in Batchelder FIGS. 2 and 3, the impeller drives the heat transfer fluid radially outward from the center of the impeller through a network of heat exchange narrow passageways. Batchelder does not teach an open and unobstructed chamber interior for free and low resistance heat transfer flow. Batchelder does not teach the simple active heat sink configuration having an impeller with a path of impeller rotation and gathering heat and releasing transfer liquid along liquid flow paths determined by the impeller rotation.

Paterson, U.S. Pat. No. 5,390,077, issued on Feb. 14, 1995, discloses an integrated circuit cooling device having an internal baffle. Paterson includes a cooling fluid chamber which rests on top of a heat source and contains cooling fluid in both liquid and gaseous phases. The cooling fluid evaporates within the chamber, rises between two upwardly tapering barrier structures to emerge from the middle of these structures and make contact with cooler upper and side chamber walls having heat fins, where it condenses and falls back around the outer periphery of the barrier structures into the liquid phase pool of cooling fluid.

Remsburg, U.S. Pat. No. 5,864,466, issued on Jan. 26, 1999 teaches a thermosyphon-powered jet-impingement cooling device similar in general design to Paterson, except that the condensed cooling fluid returns to the pool of liquid fluid at the center of the barrier structure and causes a boundary layer minimizing jet action against the heat source abutting wall of the chamber.

Other liquid and gaseous fluid flow cooling devices found in the search are Schneider, et al., U.S. Pat. No. 5,950,714, issued on Sep. 14, 1999 for a tubular cooling apparatus for an electronic component, the tube containing a venturi member; Messina, U.S. Pat. No. 5,309,319, issued on May 3, 1994 for an integral cooling system for electric components; Mansingh, U.S. Pat. No. 5,020,586, issued on Jun. 4, 1991 for an air-cooled heat exchanger for electronic circuit modules; and Reichard, U.S. Pat. No. 5,316,077, issued on May 31, 1994 for a heat sink for electrical circuit components.

It is thus an object of the present invention to provide a heat sink apparatus having a simple and reliable construction including a chamber containing a heat transfer material in liquid or solid phase and an impeller having a path of impeller rotation and gathering heat and releasing liquid phase transfer material along liquid flow paths determined by the impeller rotation to a heat exchange region thermally remote from the heat source for heat dissipation.

It is another object of the present invention to provide such a heat sink apparatus which transfers heat away from a heat source with greater efficiency than existing cold plates by distributing liquid phase heat transfer material uniformly over the heat transfer wall adjacent to or adjoining the heat source so that there are no dead spaces in this region and mechanically forcing liquid phase heat transfer material flow within the thermal boundary layer of the liquid.

It is yet another object of this invention to provide such a heat sink apparatus which will have a thin plate like configuration that can be directly attached to a circuit board type device. In this case, heat from a localized heat source is gathered by the fluid driven by an adjacent impeller and transferred via the liquid flow to a heat exchange region thermally remote from the heat source for heat dissipation.

It is still another object of the present invention to provide such a heat sink apparatus in which very high heat transfer rates are possible over localized surface areas using independently controlled impellers, such that overall power requirement and system pressures are relatively low, both modular and integrated designs are feasible.

Another goal of this invention is to provide such a heat sink in which special liquid or solid phase heat transfer materials can be used in modules, and in which design is scalable.

Another object of this invention is to ease the manufacture and assembly of the heat sink. This is accomplished by using a phase change heat transfer material that is in its solid phase under normal ambient conditions, thereby eliminating problems associated with flowable (i.e. liquid) heat transfer materials. During operation, the phase change material absorbs heat from the heat source, melts, and the liquid phase is then used to transfer heat in an active mode.

It is yet another object of the present invention to provide a heat sink in which heat can be efficiently transferred through regions not swept by an impeller by conduction through porous inserts.

It is yet another object of the present invention to provide such a heat sink apparatus which provides an internal pumping effect so that the external pump may be omitted in many cases.

It is finally an object of the present invention to provide such a heat sink apparatus which is economical to manufacture and reliable.

SUMMARY OF THE INVENTION

The present invention accomplishes the above-stated objectives, as well as others, as may be determined by a fair reading and interpretation of the entire specification.

A heat transfer apparatus is provided, including a heat source having a heat source maximum operating temperature; and a heat sink including a closed chamber having a chamber first end wall, a chamber second end wall and a circumferential chamber side wall interconnecting the chamber first end wall and the chamber second end wall, the walls defining a chamber interior space, at least one of the chamber first end wall and the chamber second end wall being a heat transfer wall, a heat transfer material retained within the chamber, and at least one impeller having an axis of impeller rotation and an impeller radius mounted within the chamber adjacent to the heat source to rotate about the axis of impeller rotation for moving the heat transfer material over the heat transfer wall and propelling the heat transfer material to a location thermally remote from the heat source for heat dissipation, where the chamber interior space extends perpendicular to the axis of impeller rotation a radial thermal spacing distance of at least two times the impeller radius.

The heat transfer material preferably is one of: a liquid; a liquid-in-liquid emulsion; a liquid-vapor mixture; a solid-in-liquid suspension and a phase change material-in-liquid suspension. The chamber optionally contains a conductive porous structure. The heat transfer apparatus optionally includes at least two impellers, the impellers operating and being controlled independently of each other. At least one of: the chamber first end wall, the chamber second end wall and the circumferential chamber side wall preferably include at least one heat fin. The heat transfer wall preferably is one of: in thermal contact with the heat source and includes at least a portion of heat source.

A heat transfer apparatus is further provided, including a heat source having a heat source maximum operating temperature; and a heat sink including a closed chamber having a chamber first end wall, a chamber second end wall and a circumferential chamber side wall interconnecting the chamber first end wall and the chamber second end wall, the walls defining a chamber interior space, at least one of the chamber first end wall and the chamber second end wall being a heat transfer wall in thermal contact with the heat source, a phase change heat transfer material retained within the chamber, and at least one impeller having an axis of impeller rotation and an impeller radius mounted within the chamber adjacent to the heat source to rotate about the axis of impeller rotation for moving any of the phase change materials in its liquid phase over the heat transfer wall and propelling the heat transfer material to a location thermally remote from the heat source for heat dissipation.

The chamber optionally once again contains a conductive porous structure. The heat transfer apparatus optionally once again includes at least two impellers, the impellers operating and being controlled independently of each other. At least one of: the chamber first end wall, the chamber second end wall and the circumferential chamber side wall, includes at least one heat fin. The heat transfer wall preferably one of: is in thermal contact with the heat source and includes at least a portion of heat source.

A heat transfer apparatus is still further provided, including a heat source having a heat source maximum operating temperature; and a heat sink including a chamber having a chamber first end wall, a chamber second end wall and a circumferential chamber side wall interconnecting the chamber first end wall and the chamber second end wall, the walls defining a chamber interior space, at least one of the chamber first end wall and the chamber second end wall being a heat transfer wall in thermal contact with the heat source, a heat transfer material retained within the chamber, and at least one impeller having an axis of impeller rotation and an impeller radius mounted within the chamber adjacent to the heat source to rotate about the axis of impeller rotation for moving the material over the heat transfer wall and propelling the material to a heat exchange region that is external to the chamber.

The chamber optionally once again contains a conductive porous structure. The heat transfer apparatus optionally once again includes at least two impellers, the impellers operating and being controlled independently of each other. At least one of: the chamber first end wall, the chamber second end wall and the circumferential chamber side wall, includes at least one heat fin. The heat transfer wall preferably one of: is in thermal contact with the heat source and includes at least a portion of heat source. The heat transfer material preferably is one of: a liquid; a liquid-in-liquid emulsion; a liquid-vapor mixture; a solid-in-liquid suspension and a phase change material-in-liquid suspension.

A heat transfer apparatus is yet further provided, including a heat source having a heat source maximum operating temperature; and a heat sink including a closed chamber having a chamber first end wall, a chamber second end wall and a circumferential chamber side wall interconnecting the chamber first end wall and the chamber second end wall, the walls defining a chamber interior space, the circumferential chamber side wall being a heat transfer wall in thermal contact with the heat source; a heat transfer material retained within the chamber, the heat transfer material being one of: a liquid; a liquid-in-liquid emulsion; a liquid-vapor mixture, a solid-in-liquid suspension, a phase change material, and a phase change material-in-liquid suspension; and at least one impeller having an axis of impeller rotation and an impeller radius mounted within the chamber adjacent to the heat source to rotate about the axis of impeller rotation for moving any of the heat transfer material in its liquid phase over the heat transfer wall and propelling the heat transfer material to a location thermally remote from the heat source for heat dissipation.

The chamber optionally contains a conductive porous structure. The apparatus optionally includes at least two impellers, the impellers operating and controlled independently of each other.

BRIEF DESCRIPTION OF THE DRAWINGS

Various other objects, advantages, and features of the invention will become apparent to those skilled in the art from the following discussion taken in conjunction with the following drawings, in which.

DETAILED DESCRIPTION OF THE PREFERRED EMBODIMENTS

Figure 1:
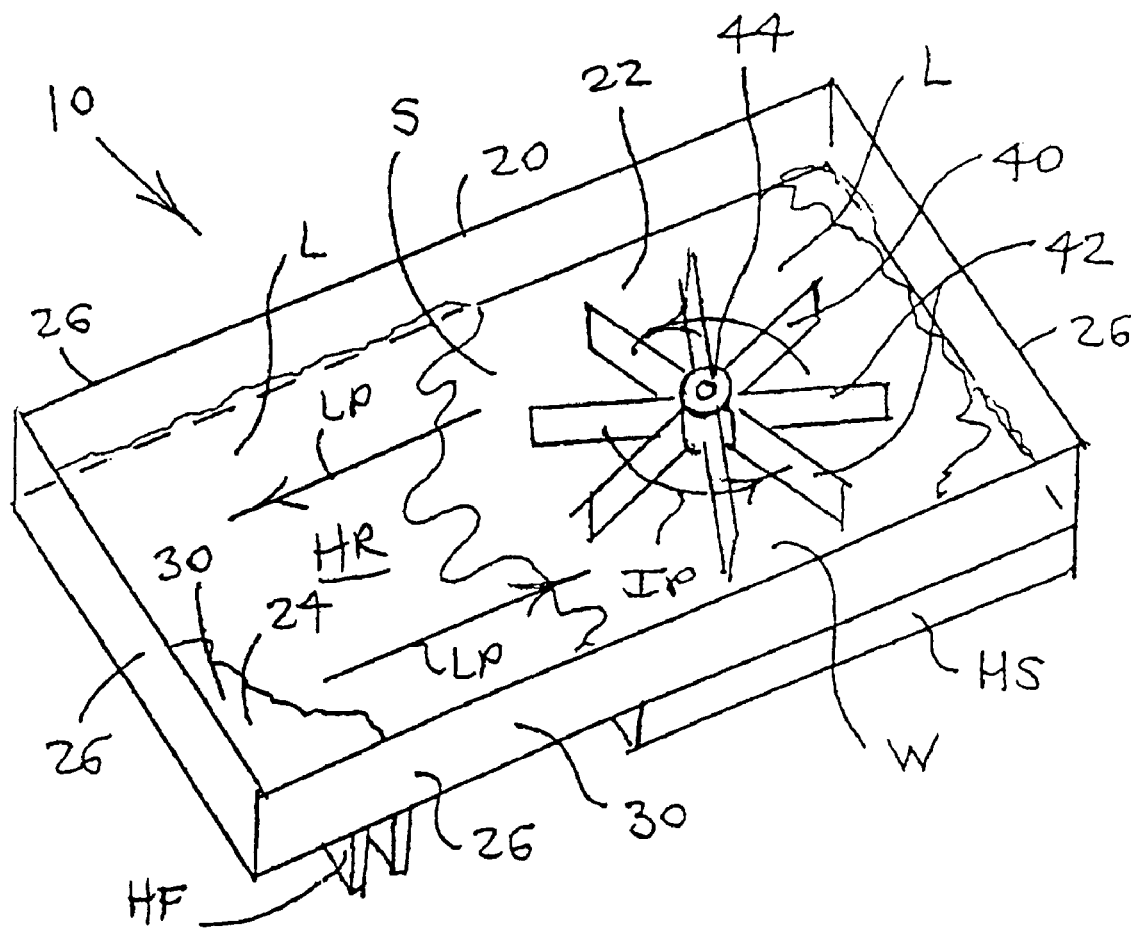
FIG. 1 is a perspective view of the heat sink of the first embodiment mounted against a heat source, with most of the second end wall removed to reveal the impeller, impeller blade path, heat transfer liquid and liquid flow paths, heat transfer wall and heat exchange region.

As required, detailed embodiments of the present invention are disclosed herein; however, it is to be understood that the disclosed embodiments are merely exemplary of the invention which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Reference is now made to the drawings, wherein like characteristics and features of the present invention shown in the various FIGURES are designated by the same reference numerals.

The Invention Generally

Figure 2:
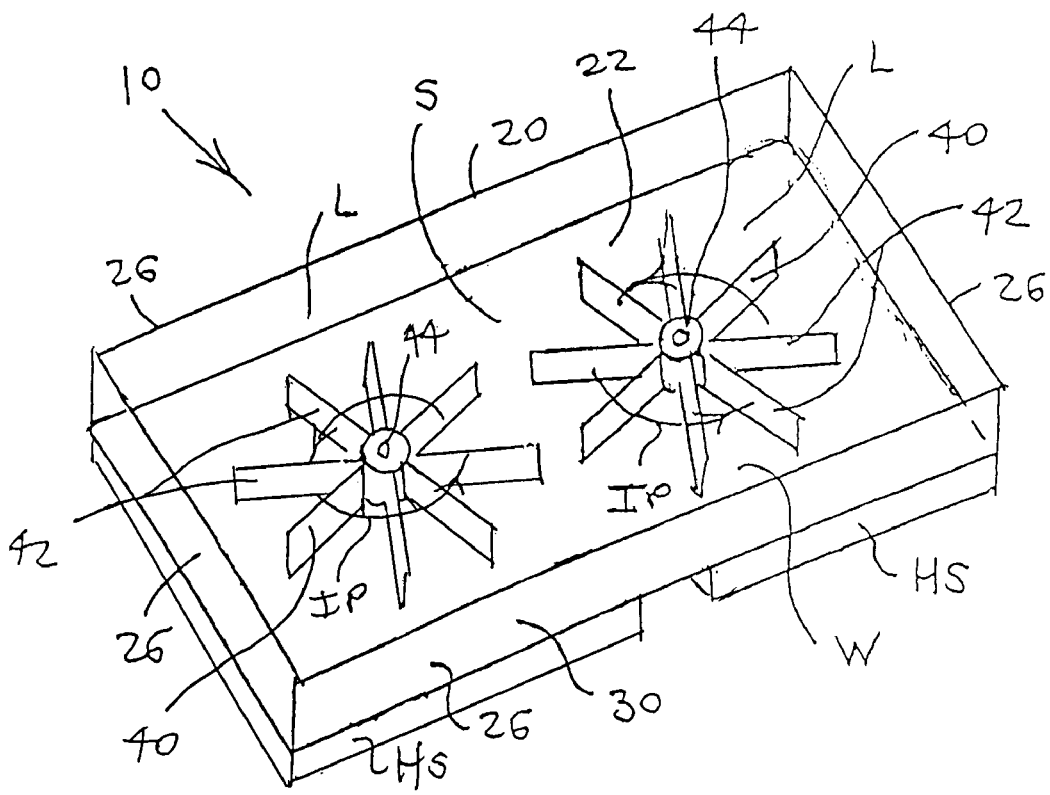
FIG. 2 is a view as in FIG. 1, showing the optional inclusion of multiple impellers for the closed chamber first embodiment.
Figure 3:
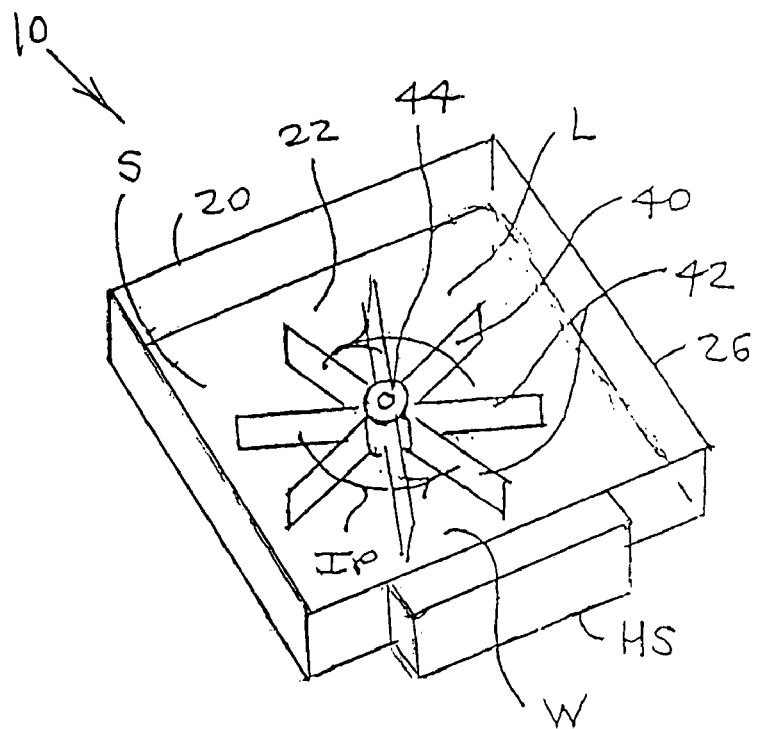
FIG. 3 is a view substantially as in FIG. 1, with the chamber narrowed to closely fit the impeller and with a heat sink mounted against or incorporated into the circumferential chamber side wall.
Figure 4:
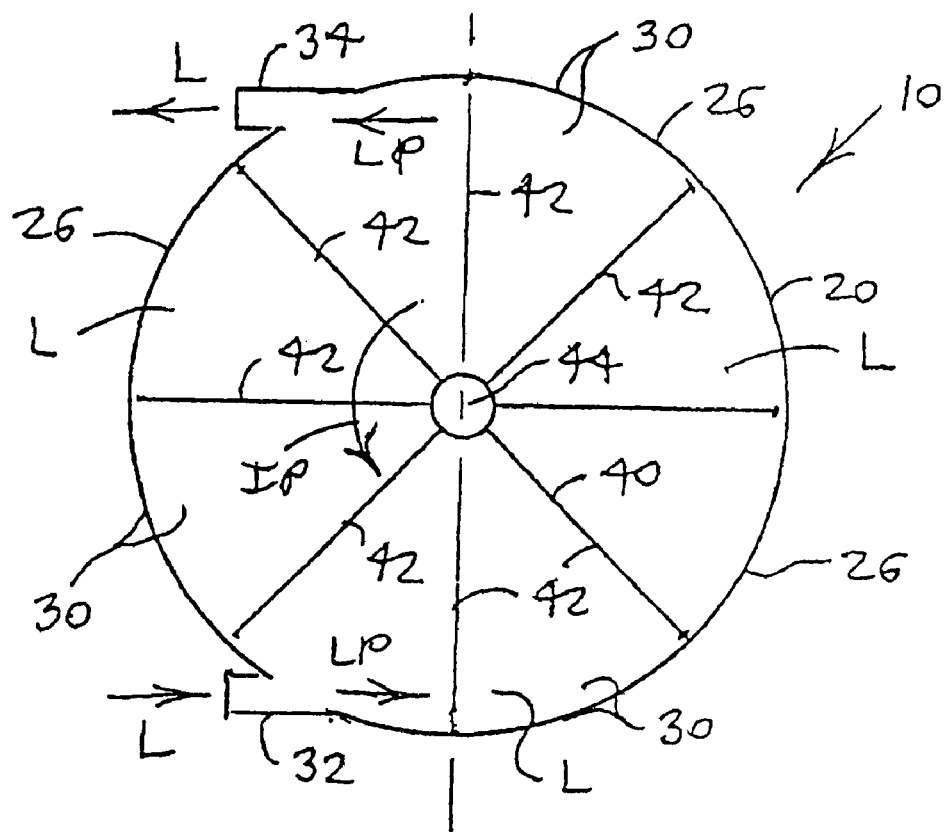
FIG. 4 is a cross-sectional end view of the heat sink of the second embodiment, with the second end wall removed.
Figure 5:
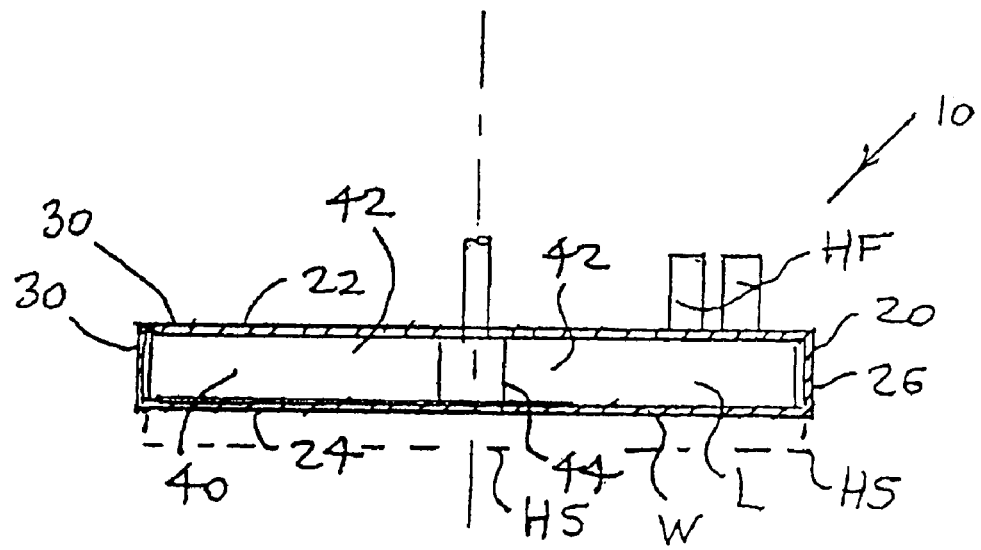
FIG. 5 is a cross-sectional side view of the heat sink of FIG. 4.

Referring to FIGS. 1–5, a heat sink 10 is disclosed including a chamber 20 having a chamber first end wall 22 and a chamber second end wall 24 and a circumferential chamber side wall 26 interconnecting the chamber first end wall 22 and the chamber second end wall 24, at least one of the chamber first end wall 22, the chamber second end wall 24 and the circumferential chamber side wall 26 being a heat transfer wall W in thermal contact with a heat source HS, such as an integrated circuit, or the heat transfer wall W itself being a part of a heat source HS to eliminate contact resistance to heat flow. See FIGS. 1 and 5. The chamber 20 contains a heat transfer material M and one or more impellers 40 each rotating about an impeller axis A and preferably having an impeller hub 44 and radial blades 42 extending from the impeller hub 44 toward the circumferential chamber side wall 26 for moving the material M over the heat transfer wall W and propelling the material M to a heat exchange region HR thermally remote from the heat source HS for heat dissipation, the chamber 20 being configured so that the impeller blades 42 gather and release the liquid L along liquid flow paths LP tangential to the path of impeller blade 42 rotation IP. See FIGS. 1 and 4. The impeller blades 42 preferably pass very close to and within the liquid thermal boundary layer against the one or more heat transfer wall(s) W for enhanced heat transfer efficiency. The periphery of the chamber 20, and thus of the circumferential chamber side wall 26 and of the entire heat sink 10, may be circular, square or virtually any other shape. Heat fins HF preferably are provided on at least one of the chamber 20 exterior surfaces. Where multiple impellers 40 are provided within the chamber 20, these impellers 40 may all spin at the same time and at the same speed, or may be independently controlled to spin at different times, at different speeds or in different rotational directions, or to spin at times, speeds or directions varying for any given impeller 40 from moment to moment in a planned or random sequence.

The heat transfer material M preferably is a phase change substance which becomes and remains in liquid phase with heat received from the heat source HS adjacent to the heat transfer wall W and which remains in a solid phase a certain distance away from the heat source HS where less heat is received from the heat source. The heat transfer material M absorbs heat as the heat transfer material M undergoes phase change from solid to liquid, so that the phase change increases the heat capacity of a given volume of heat transfer material M. Where the heat transfer material M is a phase change material, the heat sink 10 is passive when heat received from the heat source HS is insufficient to raise the temperature of the heat transfer material M to the material M melting point, because the heat transfer material M cannot be propelled by the impeller 40 when in solid phase. Furthermore, the material M in solid phase surrounding the impeller 40 typically would prevent impeller 40 rotation until the material M melts. Yet, by the same token, the heat sink 10 becomes active when heat received is sufficient to raise the temperature of the heat transfer material M above the heat transfer material M melting point, because the melting of the heat transfer material M frees the impeller 40 to begin rotation, and permits material M flow. The use of a phase change heat transfer material M provides an additional advantage over a constant phase liquid heat transfer material M during heat sink 10 assembly, because the phase change heat transfer material M is solid during heat sink 10 assembly and thus cannot leak while the chamber 20 is filled and sealed. The heat transfer material M alternatively is a suspension or an emulsion of phase change materials.

It is further contemplated that a porous structure 52 optionally is placed in the chamber 20, filling substantially all of chamber 20 internal space S around the impeller or impellers 40. The porous structure 52 functions to contain liquid phase change heat transfer material M and increases heat transfer efficiency. The heat transfer material M may be one of: a liquid; a liquid-in-liquid emulsion; a liquid-vapor mixture; a solid-in-liquid suspension and a phase change material-in-liquid suspension.

Where the heat source HS is in thermal contact with the circumferential chamber side wall 26, a phase change heat transfer material M is particularly well suited because the centrifugal force ensures good contact of the heavier solid phase during melting and the impeller ensures that the solid layer on the cold section of the periphery (such as along the inward surface of the circumferential chamber side wall 26) is continuously scraped off. A small portion of the circumferential chamber side wall 26 is in thermal contact with the heat source HS, such as by incorporating part of the heat source HS itself, and the remainder of the circumferential chamber side wall 26 dissipates heat.

First Preferred Embodiment

The chamber 20 of the first embodiment preferably is closed and has a chamber interior space S extending perpendicularly to the axis A of impeller 40 rotation a radial thermal spacing distance of at least the radius of the impeller 40, and preferably a radial thermal spacing distance of at least one and one fifth the radius of the given impeller 40 so that the liquid L flows to a chamber heat exchange region HR remote from the heat source HS for heat dissipation. See FIGS. 1 and 2. Heat exchange efficiency is increased with larger thermal spacing distances from the axis A, and contemplated such distances include at least one and one half, at least twice, at least three times and at least four times the radius of the given impeller 40. A thermally remote heat exchange region HR may alternatively or additionally be created by making the chamber 20 depth greater than the impeller 40 axial depth, so that the chamber second end wall 24 is spaced from the impeller 40 an axial thermal spacing distance of at least one fifth the impeller 40 axial depth, and preferably an axial thermal spacing distance of one of: at least one half, at least one, at least twice, at least three times and at least four times the axial depth of the impeller 40.

It is noted that for all of the closed configurations of the first embodiment, a small additional volume/air space is required to accommodate any change in density brought about by a change in temperature or a phase change in the heat transfer material M.

Second Preferred Embodiment

The chamber 20 of a second embodiment is open, having a chamber circumferential region 30 and a chamber entry port 32 and a chamber exit port 34 in the chamber circumferential region 30 so that impeller blades 42 sweep past the circumferential region 30 and draw liquid into the chamber 20 from the chamber entry port 32 and propel liquid out of the chamber 20 through the chamber exit port 34. See FIGS. 4 and 5. The circumferential chamber side wall 26 is sufficiently continuous that heat transfer liquid L propelled by the impeller blades 42 is constrained to flow along a generally circular or circumferential path about the impeller hub 44 from the entry port 32 to the exit port 34. The chamber circumferential region 30 includes the circumferential chamber side wall 26 and the peripheral portions of the chamber first end wall 22 and the chamber second end wall 24. An example of one contemplated chamber 20 configuration showing preferred entry and exit port locations is attached and marked as FIGS. 4 and 5.

The heat sink 10 may be connected to a heat exchange structure (not shown) external to the chamber 20 which contains and recirculates the heat transfer liquid L from the exit port 34 back to the exit port 32, so that the heat transfer liquid L discharges some of its heat into the environment prior to chamber 20 re-entry. Alternatively, a heat exchange structure is omitted and the chamber entry and exit ports are open to heat transfer liquid L in the environment surrounding the chamber 40. It is understood that the wide chamber 20 of the first embodiment is optionally combined with the chamber entry port 32 and chamber exit port 34 of the second embodiment.

While the invention has been described, disclosed, illustrated and shown in various terms or certain embodiments or modifications which it has assumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim as my invention:

1. A heat transfer apparatus, comprising:
   a heat source having a heat source maximum operating temperature;
   and a heat sink comprising a closed chamber having a chamber first end wall, a chamber second end wall and a circumferential chamber side wall interconnecting said chamber first end wall and said chamber second end wall, said walls defining a chamber interior space, at least one of said chamber first end wall and said chamber second end wall being a heat transfer wall, a heat transfer material retained within said chamber, and at least one impeller having an axis of impeller rotation and an impeller radius mounted within said chamber adjacent to said heat source to rotate about the axis of impeller rotation for moving the heat transfer material over said heat transfer wall and propelling said heat transfer material to a location thermally remote from said heat source for heat dissipation, wherein said chamber interior space extends perpendicular to the axis of impeller rotation a radial thermal spacing distance of at least two times the impeller radius.

2. The heat transfer apparatus of claim 1, wherein said heat transfer material is one of: a liquid; a liquid-in-liquid emulsion; a liquid-vapor mixture; a solid-in-liquid suspension and a phase change material-in-liquid suspension.

3. The heat transfer apparatus of claim 1, wherein said chamber contains a conductive porous structure.

4. The heat transfer apparatus of claim 1, comprising at least two said impellers, said impellers operating and being controlled independently of each other.

5. The heat transfer apparatus of claim 1, wherein at least one of: said chamber first end wall, said chamber second end wall and said circumferential chamber side wall, comprises at least one heat fin.

6. The heat transfer apparatus of claim 1, wherein said heat transfer wall one of: in thermal contact with said heat source and comprises at least a portion of heat source.

7. A heat transfer apparatus, comprising:
   a heat source having a heat source maximum operating temperature;
   and a heat sink comprising a closed chamber having a chamber first end wall, a chamber second end wall and a circumferential chamber side wall interconnecting said chamber first end wall and said chamber second end wall, said walls defining a chamber interior space, at least one of said chamber first end wall and said chamber second end wall being a heat transfer wall in thermal contact with the heat source, a phase change heat transfer material retained within said chamber, and at least one impeller having an axis of impeller rotation and an impeller radius mounted within said chamber adjacent to said heat source to rotate about the axis of impeller rotation for moving any said phase change material in its liquid phase over said heat transfer wall and propelling said heat transfer material to a location thermally remote from said heat source for heat dissipation.

8. The heat transfer apparatus of claim 7, wherein said chamber contains a conductive porous structure.

9. The heat transfer apparatus of claim 7, comprising at least two said impellers, said impellers operating and being controlled independently of each other.

10. The heat transfer apparatus of claim 7, wherein at least one of: said chamber first end wall, said chamber second end wall and said circumferential chamber side wall, comprises at least one heat fin.

11. The heat transfer apparatus of claim 7, wherein said heat transfer wall one of: is in thermal contact with said heat source and comprises at least a portion of heat source.

12. A heat transfer apparatus, comprising:
   a heat source having a heat source maximum operating temperature;
   and a heat sink comprising a chamber having a chamber first end wall, a chamber second end wall and a circumferential chamber side wall interconnecting said chamber first end wall and said chamber second end wall, said walls defining a chamber interior space, at least one of said chamber first end wall and said chamber second end wall being a heat transfer wall in thermal contact with the heat source, a heat transfer material retained within said chamber, and at least one impeller having an axis of impeller rotation and an impeller radius mounted within said chamber adjacent to the heat source to rotate about the axis of impeller rotation for moving the material over the heat transfer wall and propelling said material to a heat exchange region that is external to the said chamber.

13. The heat transfer apparatus of claim 12, wherein said chamber contains a conductive porous structure.

14. The heat transfer apparatus of claim 12, comprising at least two said impellers, said impellers operating and controlled independently of each other.

15. The heat transfer apparatus of claim 12, wherein at least one of: said chamber first end wall, said chamber second end wall and said circumferential chamber side wall, has at least one heat fin.

16. The heat transfer apparatus of claim 12, wherein said heat transfer wall one of: in thermal contact with said heat source and comprises at least a portion of heat source.

17. The heat transfer apparatus of claim 12, wherein said heat transfer material is one of: a liquid; a liquid-in-liquid emulsion; a liquid-vapor mixture; a solid-in-liquid suspension and a phase change material-in-liquid suspension.

18. A heat transfer apparatus, comprising:
   a heat source having a heat source maximum operating temperature;
   and a heat sink comprising a closed chamber having a chamber first end wall, a chamber second end wall and a circumferential chamber side wall interconnecting said chamber first end wall and said chamber second end wall, said walls defining a chamber interior space, said circumferential chamber side wall being a heat transfer wall in thermal contact with the heat source; a heat transfer material retained within said chamber, said heat transfer material being one of: a liquid; a liquid-in-liquid emulsion; a liquid-vapor mixture, a solid-in-liquid suspension, a phase change material, and a phase change material-in-liquid suspension; and at least one impeller having an axis of impeller rotation and an impeller radius mounted within said chamber to rotate about the axis of impeller rotation for moving any said heat transfer material in its liquid phase over said heat transfer wall for heat dissipation.

19. The heat transfer apparatus of claim 18, wherein said chamber contains a conductive porous structure.

20. The heat transfer apparatus of claim 18, comprising at least two said impellers, said impellers operating and controlled independently of each other.

* * * * *